(12) United States Patent
Weichslberger et al.

(10) Patent No.: US 8,685,196 B2
(45) Date of Patent: Apr. 1, 2014

(54) METHOD FOR PRODUCING A MULTILAYER PRINTED CIRCUIT BOARD, ADHESION PREVENTION MATERIAL AND MULTILAYER PRINTED CIRCUIT BOARD AND USE OF SUCH A METHOD

(75) Inventors: Günther Weichslberger, Graz (AT); Johannes Stahr, St. Lorenzen/Mürztal (AT); Markus Leitgeb, Trofaiach (AT); Andreas Zluc, Leoben (AT); Gerald Weidinger, Leoben (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 144 days.

(21) Appl. No.: 13/145,651

(22) PCT Filed: Jan. 22, 2010

(86) PCT No.: PCT/AT2010/000024
§ 371 (c)(1),
(2), (4) Date: Jul. 21, 2011

(87) PCT Pub. No.: WO2010/085830
PCT Pub. Date: Aug. 5, 2010

(65) Prior Publication Data
US 2011/0272177 A1   Nov. 10, 2011

(30) Foreign Application Priority Data
Jan. 27, 2009   (AT) .................. GM47/2009

(51) Int. Cl.
*B29C 65/18*   (2006.01)
*B32B 37/26*   (2006.01)
*B32B 38/10*   (2006.01)
*B32B 38/14*   (2006.01)

(52) U.S. Cl.
USPC ........... 156/247; 156/258; 156/277; 156/278; 156/289; 156/719

(58) Field of Classification Search
USPC ......... 156/247, 250, 252, 257, 277, 278, 289, 156/308.2, 308.4, 701, 719, 258
See application file for complete search history.

(56) References Cited

U.S. PATENT DOCUMENTS

| 5,144,534 A | 9/1992 | Kober |
| 5,650,253 A * | 7/1997 | Baker et al. .................. 430/45.2 |

(Continued)

FOREIGN PATENT DOCUMENTS

| EP | 1 616 909 | 1/2006 |
| EP | 1 674 230 | 6/2006 |

(Continued)

*Primary Examiner* — Sing P Chan
(74) *Attorney, Agent, or Firm* — Jacobson Holman PLLC

(57) ABSTRACT

In a method for producing a multilayer printed circuit board from a plurality of conducting or conductive and non-conducting or insulating layers or plies to be connected to each other, in particular to be pressed together, wherein after connecting at least partially planar layers at least a partial region (11) thereof is removed, and wherein in order to prevent adherence of the partial region (11) to be removed a material (8) preventing adhesion is applied in accordance with the partial region to be removed onto a layer (9) which adjoins the partial region to be removed, it is provided that the material (8) preventing adhesion is formed by a mixture comprising a release agent on the basis of at least one metal soap, preferably the fatty acid salts of Al, Mg, Ca, Na and Zn, a binding agent, and a solvent, whereby a partial region to be removed can be removed easily and reliably after appropriate treatment and/or processing steps of the multilayer printed circuit board. In addition, an adhesion prevention material and a use of the method in connection with the production of a multilayer printed circuit board (1) are provided.

37 Claims, 6 Drawing Sheets

(56) References Cited

U.S. PATENT DOCUMENTS

| | | | |
|---|---|---|---|
| 5,652,282 A * | 7/1997 | Baker et al. | 523/201 |
| 5,663,116 A * | 9/1997 | Kamimura et al. | 503/227 |
| 6,183,814 B1 * | 2/2001 | Nangeroni et al. | 427/361 |
| 2002/0122922 A1 * | 9/2002 | Yamada et al. | 428/204 |
| 2005/0141926 A1 * | 6/2005 | Baker et al. | 399/296 |
| 2005/0142471 A1 * | 6/2005 | Baker et al. | 430/47 |
| 2006/0272768 A1 | 12/2006 | Kitamura | |
| 2010/0059262 A1 * | 3/2010 | Weidinger et al. | 174/258 |
| 2010/0233146 A1 * | 9/2010 | McDaniel | 424/94.2 |
| 2011/0240064 A1 * | 10/2011 | Wales et al. | 134/26 |
| 2012/0015008 A1 * | 1/2012 | Sugiura et al. | 424/400 |

FOREIGN PATENT DOCUMENTS

| | | |
|---|---|---|
| EP | 1 698 655 | 9/2006 |
| WO | 2008/098269 | 8/2008 |
| WO | 2008/098271 | 8/2008 |

* cited by examiner

METHOD FOR PRODUCING A MULTILAYER PRINTED CIRCUIT BOARD, ADHESION PREVENTION MATERIAL AND MULTILAYER PRINTED CIRCUIT BOARD AND USE OF SUCH A METHOD

This a national stage of PCT/AT2010/000024 filed Jan. 22, 2010 and published in German, which has a priority of Austria no. GM 47/2009 filed Jan. 27, 2009, hereby incorporated by reference.

FIELD OF THE INVENTION

The present invention relates to a method for producing a multilayer printed circuit board from a plurality of conducting or conductive and non-conducting or insulating layers or plies to be connected to each other, in particular to be pressed together, wherein after connecting at least partially planar layers at least a partial region thereof is removed, and wherein in order to prevent adherence of the partial region to be removed a material preventing adhesion is applied in accordance with the partial region to be removed onto a layer which adjoins the partial region to be removed. The present invention, moreover, relates to an adhesion prevention material for use in such a method, a multilayer printed circuit board produced according to such a method and/or by using such an adhesion prevention material, and the use of such a method or adhesion prevention material in connection with the production of a multilayer printed circuit board.

Although the subsequent description refers to the production of a multilayer printed circuit board, it should be understood that the method according to the invention may be used in the most diverse fields of application, wherein it is aimed to remove a partial region from a substantially planar material layer after connection with at least one further substantially planar material layer. In general, the present invention is applicable in connection with multilayer structures from which, after the production of a multilayer structure, a partial region is to be stripped, or one of the layers or plies is to be removed at least partially. In this context, complex methods and constructions are, for instance, known, which, in particular by prefinishing at least one connection layer used for connecting the material layers to be connected and by accordingly high operation expenditures as well as accordingly high expenditures required for the subsequent proper orientation or registration of the material layers to be connected, aim to strip or remove partial regions after the connection of such material layers. The substantially planar material layers, besides multilayer printed circuit boards, may for instance comprise paper-like or cardboard-like layers or elements to be connected, substantially plate-shaped or sheet-shaped element such as, e.g., foils, sheets or metal plates or the like. In the context of connecting substantially planar or plate-shape materials, it is, for instance, known, in particular with a view to an optionally required subsequent removal of at least a partial region, to appropriately prefinish foils having adhesive properties such that partial regions of the foils which, during a connecting procedure, are to ensure the adhesion of the material layers to be connected are provided with recesses.

PRIOR ART

In addition to substantially continuous adhesive foils, prefinished separation foils may alternatively be used as a function of the partial region to be subsequently removed, as can, for instance, be taken from DE-C 40 03 344. It is immediately apparent that the prefinishing of such connection foils or adhesive foils and/or separation foils involves accordingly high expenditures and, in addition, places accordingly high demands on the registration and orientation of the material layers to be connected via the interposition of such, in particular prefinished, foils.

From WO 2008/098271 or WO 2008/098269, a method of the initially defined kind can, for instance, further be taken, wherein a waxy paste is used as an adhesion prevention or anti-adhesion material, whereby such a waxy paste, after its application and the subsequent pressing of a multilayer circuit board comprised of several layers under elevated pressure and/or elevated temperature may cause the leaking of the anti-adhesion material. The use of a waxy material, moreover, involves the drawback that such an anti-adhesion material can hardly be removed—or only at extremely high efforts—after the removal of the partial region to be removed, in order to enable, for instance, the subsequent patterning and/or contacting of the multilayer circuit board in the region from which the partial region to be removed was removed.

In the context of the production of multilayer electronic components and, in particular, multilayer printed circuit boards, the design of such electronic components, which has increased in complexity during the past years, has generally led to an increase in the number of connecting points between active components and components of a printed circuit board, wherein the increasing reduction of size has, at the same time, called for a reduction of the distance between such connecting points. In the context of the production of printed circuit boards, the disentanglement of such component connecting points by microvias through several circuit board layers in so-called high density interconnects (HDI) has been proposed.

In addition to a growing increase in the complexity of the design and construction of printed circuit boards, for instance in connection with the formation of cavities or hollow spaces and the thus involved miniaturization, further requirements with a view to providing foldable or bendable connections in a circuit board have come up, which have led to the development of a hybrid technology and the use of so-called rigid-flexible printed circuit boards. Such rigid-flexible printed circuit boards, which comprise circuit board rigid portions or partial regions as well as flexible portions connecting such rigid portions, have enhanced reliability, offering further or additional options of freedom in terms of design and construction and enabling further miniaturization.

For the production of such rigid-flexible printed circuit boards, connection layers corresponding to the rigid and flexible portions of a circuit board and made of dielectric materials are to be provided between said portions, whereby the arrangement of appropriate sheet-shaped layers or films which, for instance, by heat treatment will cause the connection of circuit board rigid and flexible portions to be connected will usually result in comparatively thick layers. Such thick layers not only counteract the intended miniaturization in the fabrication of multilayer circuit boards, but also entail losses of the registering accuracy required for subsequent laser borehole geometries for the formation of microvias and accordingly narrowly spaced-apart connection sites. Such known, thick layers made of non-conductive material, or dielectric layers, moreover, require additional processing or process steps and/or more complex designs for the production of the connections required between the rigid and flexible portions of circuit boards, since, in particular, appropriate prefinishing or formatting must be performed as a function of the subsequent separation or severance of the rigid portions of the printed circuit board.

SUMMARY OF THE INVENTION

While avoiding the problems of the above-mentioned prior art, the present invention aims to provide a method for producing a multilayer printed circuit board, wherein, after having connected, particularly pressed, several layers or plies, a partial region can be reliably removed and, in particular, a readily and reliably applicable material preventing adhesion is provided, which, in addition, can preferably be readily and reliably and completely removed again after the removal of the partial region to be removed, so as to ensure the reliable further processing of the multilayer printed circuit board also in the region of the partial region to be removed. The invention, moreover, aims to provide such an adhesion prevention material or anti-adhesion material for use in such a method, a multilayer printed circuit board and the use of the method or anti-adhesion material for the production of a multilayer printed circuit board while avoiding the above-mentioned problems of the prior art and realizing the above-mentioned aims and characteristic features.

To solve these objects, a method for producing a multilayer printed circuit board of the initially defined kind is essentially characterized in that the material preventing adhesion is formed by a mixture comprising a release agent on the basis of at least one metal soap, preferably the fatty acid salts of Al, Mg, Ca, Na and Zn, a binding agent, and a solvent. Since the adhesion-preventing material according to the invention, in addition to a binding agent and a solvent, comprises at least one metal soap as a release agent, it will be ensured that the adhesion-preventing material can be readily and reliably applied and provide an optimum separation effect even after, in particular, several processing procedures in the production of a multilayer printed circuit board, particularly with regard to connecting individual layers or plies, especially under elevated temperature and/or elevated pressure. Moreover, it turned out that, when using at least one metal soap as a release agent, improved patterning when applying the adhesion-preventing material will be achieved as opposed to known materials like, e.g., waxy pastes, and that such a pattern will be reliably maintained even during the subsequent connecting or pressing procedure. According to the invention, such metal soaps are preferably used in the form of the fatty acid salts of Al, Mg, Ca, Na or Zn, this providing, in particular, easily and reliably workable and processable materials safely preventing the adherence of a partial region and thus enabling the simple and subsequent removal of the same.

In order to provide reliably workable and processable release agents for achieving the desired anti-adhesion properties, it is proposed according to a preferred embodiment that the release agent is used on the basis of saturated and unsaturated fatty acids such as, e.g., stearic, palmitic and olic acids.

In order to obtain the desired separation effect after having produced the multilayer printed circuit board, in particular, by using an at least partially elevated pressure and/or elevated temperature, it is proposed according to a further preferred embodiment that the release agent is used in an amount of less than 60% by weight, in particular about 5% by weight to 45% by weight, of the adhesion-preventing material.

For the reliable fixation or arrangement of the adhesion-preventing material during the application procedure and, in particular, in order to ensure the adhesion of the release agent of the adhesion-preventing material according to the invention and adjust the desired rheology to enable the reliable and simple application of the adhesion-preventing material, it is, moreover, preferably proposed that a cellulose derivative, in particular cellulose ether or ester, preferably ethyl cellulose, is used as a binding agent.

When producing multilayer printed circuit boards, it is to be anticipated that, in particular, layers of cured resin and/or copper with an uncured resin layer are connected with each other in a connecting procedure, in particular a pressing procedure, particularly under elevated temperature and/or elevated pressure. In doing so, the resin of the uncured resin layer will, for instance, become liquid at temperatures of about 70° C., reaching a solid state as a duroplast by polymerization at a further increase in the temperature to about 200° C., this causing the connection of individual, adjacent layers in the production of a multilayer printed circuit board.

The use of a binder in the form of a cellulose derivative, in particular ethyl cellulose, during the connecting procedure of individual layers will, in particular, cause a migration of said binder into the adjoining layer of a resin layer liquefying during the connecting procedure, e.g. of epoxy resin or phenolic resin, of the multilayer printed circuit board such that the adhesion-preventing material will become depleted of binder during the connecting procedure due to said migration, thus further improving the subsequently desired separation effect when removing the partial region to be removed, due to the depletion of binder on a boundary layer on which the adhesion-preventing material has been or is applied.

In order to achieve the desired properties in respect to, in particular, a reliable adherence or fixation during the application procedure of the material subsequently preventing adhesion and to achieve the above-described improvement of the separation effect by migration during the connecting procedure into an adjacent layer or ply of the multilayer printed circuit board, it is proposed according to a further preferred embodiment that the amount of binding agent is chosen to be less than 35% by weight, in particular between 3% by weight and 25% by weight.

For the reliable application of the adhesion-preventing material, the latter additionally comprises a solvent, wherein, according to a further preferred embodiment of the method according to the invention, the solvent has a boiling point of below 220° C., in particular about 180° C. to 200° C. By using such a solvent having a comparatively high boiling point, it will, on the one hand, be ensured that no problems regarding, for instance, the premature drying of the same prior to the arrangement of further layers or plies of the printed circuit board to be produced will occur during the application of the adhesion-preventing material. Such a boiling point of the solvent will, on the other hand, safeguard that, when increasing the temperature, for instance up to a temperature of 220° C., in the context of connecting individual circuit board layers or plies, the solvent will be substantially completely removed or evaporated from the adhesion-preventing material.

In order to provide the desired properties of the adhesion-preventing material, it is proposed that ethylene or polypropylene glycol ethers and esters are used as solvents, as in correspondence with a further preferred embodiment of the method according to the invention. In order to provide an accordingly good processability of the adhesion-preventing material, it is, moreover, preferably proposed that the amount of solvent is less than 85% by weight, in particular 30% by weight to 80% by weight, of the adhesion-preventing material.

As already pointed out above several times, the adhesion-preventing material used in the context of the method according to the invention, particularly by using at least one metal soap as a release agent, allows for particularly reliable application and accordingly good patterning, wherein, in this context, it is proposed according to a further preferred embodiment that the adhesion-preventing material is applied by a printing process, in particular screen-printing, stencil-printing, offset printing, flexoprinting, tampon printing, ink-jet printing or the like. This will ensure a particularly simple and position-precise application of the region to be exempted from connection, or the partial region preventing adhesion, for the subsequent removal of a partial region. Such printing processes are, moreover, not only known per se, but partially also widely used in connection with the production of a printed circuit board for patterning individual layers or plies during various processing procedures or treatment steps, so that courses of procedure in the production of a multilayer printed circuit board additionally using the method according to the invention will not require a basic change of the method control for the production of a multilayer printed circuit board, with only supplemental and easily integrable method steps being sufficient.

In order to ensure particularly simple processing of the adhesion-preventing material in connection with the method according to the invention, it is, moreover, preferably proposed that the adhesion-preventing material is subjected to a drying and/or curing process after its application. Such a drying and/or curing process can be performed as a function of the materials used for the adhesion-preventing material and selected, in particular, in accordance with the adjoining material layers or plies of the multilayer printed circuit board.

In order to obtain the desired, thin layer thicknesses of the adhesion-preventing material while maintaining the exemption provided by the invention of the partial region to be removed, or preventing adherence, it is proposed according to a further preferred embodiment that the adhesion-preventing material is applied in a layer thickness of less than 25 µm and, in particular, less than 15 µm.

As already pointed out above several times, it has to be safeguarded that the adherence of the partial region to be subsequently removed will be prevented even with multiple treating or processing procedures in the context of the production of a multilayer printed circuit board under elevated temperature and/or elevated pressure. A separation principle that functions for the release agent based on at least one metal soap and provided according to the invention for the adhesion-preventing material, which separation principle enables the subsequent removal of the partial region to be removed, basically relies on the incompatibility due to polarity differences between layers or plies mutually adjoining during the connecting procedure in the production of a multilayer printed circuit board. In this context, it is proposed according to a further preferred embodiment that the adhesion-preventing material comprises a polarity difference relative to the adjoining, substantially planar layers or plies. By providing such a polarity difference between the adhesion-preventing material and the layers of a multilayer circuit board which liquefy during the connecting or pressing procedure, in particular a liquefied resin layer of epoxy resin or phenolic resin, a phase boundary will form such that the mutually adjoining layers will not mix and, in particular, no connection will be established between the adhesion prevention layer and an adjoining layer. This phase boundary will also be maintained after subsequent cooling following a connecting or pressing procedure so as to enable the accordingly safe removal of the partial region to be removed, for instance after the removal of lateral regions, as will be explained in detail below.

In order to achieve the desired separation effect by exposure due to the application of the anti-adhesion material, it is proposed according to a further preferred embodiment that the anti-adhesion material has a softening or melting point of at least 100° C. and, in particular, 120° C. Due to such a high softening or melting point of the layer of the adhesion-preventing material in the production of a multilayer printed circuit board during the connection procedure, the viscosity of the material liquefying in the course of the connecting procedure at that time will already be high enough to prevent the liquefied release agent of the adhesion-preventing material from being pressed out beyond the borders of the desired structure to be produced. It will thus be ensured that even at a further increase of the temperature during the connecting or pressing procedure as mentioned above, the exposure required for the subsequent removal of the partial region, by the adhesion-preventing material will be reliably maintained. During the connecting or pressing procedure, the adhesion-preventing material, by the formation of a liquid layer at a relatively high softening or melting point in the region of the partial region to be subsequently removed will prevent a continuous connection, for instance adhesion or connection of the mutually adjoining material layers or material layers to be connected, as is desired or sought in regions adjoining the partial region to be subsequently removed.

As already mentioned above, the use of at least one metal soap as a release agent for the adhesion-preventing material in the context of the method according to the invention will, moreover, safeguard that, after the removal of the partial region to be removed, residues of the anti-adhesion material possibly present after the removal of the partial region to be removed can be reliably eliminated, wherein, in this respect, it is proposed according to a further preferred embodiment of the method according to the invention that, after the removal of the partial region to be removed, the adhesion-preventing material is removed by applying a stripping medium.

In order to obtain the desired removal properties of the stripping medium, it is, moreover, proposed that the stripping medium is comprised of a mixture of a high-boiling solvent and an acid, as in correspondence with a further preferred embodiment of the invention. By providing a stripping medium comprised of a mixture of a high-boiling solvent and an acid, the adhesion-preventing material can be reliably removed after the removal of the partial region to be removed so as to enable further treating or processing procedures of the multilayer printed circuit board, for instance in view of further patterning and/or contacting, also in the region of the partial region to be removed.

For a particularly reliable application of the stripping medium and in order to achieve the desired cleaning or removing effect of the adhesion-preventing material, or residues thereof, after the removal of the partial region to be removed, it is proposed according to a further preferred embodiment in respect to the stripping medium that the adhesion-preventing material is removed by spraying with a, particularly heated, solvent under elevated pressure or in a dipping basin using ultrasound or mechanical agitators to enhance solubility.

In order to achieve accordingly reliable and good application properties of the stripping medium, it is proposed according to a further preferred embodiment that the stripping medium comprises at least 80%, in particular at least 90%, of the high-boiling solvent.

A particularly reliable removing effect of the adhesion-preventing material will preferably be achieved if the solvent is selected from the group consisting of ethylene glycol, diethylene glycol and polyglycol ethers, in particular butyl glycol, hexyl glycol, butyl diglycol, propylene glycol ethers and esters, in particular acetates, alcohols, ketones and esters, as well as chlorinated solvents.

In addition to a solvent having a high boiling point as indicated above, the stripping medium used in the context of the method according to the invention also comprises an acid, wherein, in order to achieve the accordingly desired cleaning effect, it is proposed according to a preferred embodiment that the acid in the stripping medium is used in an amount of less than 20% by weight and, in particular, 0.5% by weight to 10% by weight.

In order to achieve the desired removal effect, and as a function of the materials employed for the production of a multilayer printed circuit board, it is proposed according to a further preferred embodiment for the stripping medium that the acid contained in the stripping medium is comprised of inorganic acids such as, e.g., hydrochloric acid or sulfuric acid, or of organic acids such as, in particular, oxalic acid, acetic acid, formic acid, or of complexing acids such as, e.g., ethylenediamine tetracetic acid. The use of such acids will ensure the desired cleaning or removing effect of adhesion-preventing material residues, wherein, by using such acids, also an etching or polishing effect of, in particular, conducting or conductive layers can, at the same time, be achieved in the region of the anti-adhesion material to be removed, if required or if desired.

As a function of the employed stripping medium and also the materials used for the production of a multilayer circuit board, it is proposed according to a further preferred embodiment that the removal of the adhesion-preventing material is performed at a temperature below 150° C. and, in particular, between 20° C. and 120° C. In this manner, the adhesion-preventing material can be accordingly rapidly and readily removed after the removal of the partial region to be removed, while, at the same time, saving the particularly adjoining layers of the multilayer printed circuit board.

In the context of the production of a multilayer printed circuit board, it is proposed according to a further preferred embodiment that the layers or plies to be connected, of the multilayer circuit board are connected by a laminating process. In the context of such a laminating process, it is thus possible to also take into account special requirements, in particular, in connection with the production of a multilayer printed circuit board and the materials employed to this end, besides the above-mentioned material properties of the adhesion-preventing material, for instance in view of the softening or melting point of the adhesion-preventing material as well as the boiling point of the solvent contained therein.

For a particularly reliable and simple removal or separation of the partial region to be removed after having connected the planar material layers to be connected, it is, moreover, proposed that edge regions of the at least one partial region to be removed are defined and/or removed by milling, scratching, cutting, in particular laser-cutting, as in correspondence with a further preferred embodiment of the method according to the invention. Such milling, scratching, cutting or the like procedures can be accordingly precisely and reliably performed in correspondence with the planar materials to be connected, wherein, even when using materials having slight thicknesses such as, for instance, in the context of the production of a multilayer printed circuit board, an accordingly precise and reliable performance of the separation procedure will be provided. The requirements regarding the tolerances to be observed are, moreover, accordingly reduced due to the adhesion-prevention material layer.

To solve the initially defined objects, an adhesion-preventing material for use in a method according to the invention is, moreover, provided, which is essentially characterized in that the adhesion-preventing material is formed by a mixture comprising a release agent on the basis of at least one metal soap, preferably the fatty acid salts of Al, Mg, Ca, Na and Zn, a binding agent, and a solvent. This will enable the achievement of favorable properties in terms of a simple processability of the adhesion-preventing material according to the invention, reliable patterning as well as the simple and safe subsequent removal of residues of the same, as already extensively explained above.

As already indicated several times, it is, moreover, proposed according to the invention to use the method of the invention and/or the adhesion-preventing material for the production of a multilayer printed circuit board.

In particular, in the context of such use according to the invention, it is, moreover preferably proposed to use the method according to the invention, or the multilayer structure according to the invention, for the production of hollow spaces, in particular three-dimensional hollow spaces, or cavities in a printed circuit board.

The thus produced hollow spaces, cavities and, in particular, channels can further be used to transport liquid or gaseous substances or, in the case of channels, to even introduce metals of different geometric shapes for the spreading or dissipation of heat from the printed circuit board, as in correspondence with a preferred use.

It is, furthermore, conceivable to use such cavities and, in particular, channels for transmitting light or sound waves in the printed circuit board, as in correspondence with a further preferred use. In this manner, a lateral illumination from the printed circuit board can, for instance, be provided when combined with LEDs inserted in cavities.

These cavities and, in particular, channels may furthermore be used to transmit sound, thus providing great advantages in the suppression of disturbing and background noises when used, above all, in the microphone and loudspeaker fields with mobile electronic gadgets like handhelds, PDAs, cell phones etc., which would briefly be referred to as noise cancellation by the skilled artisan.

Furthermore, it is preferably proposed to provide these cavities or hollow spaces and, in particular, channels with metallic particles or insulating or inhibiting layers by galvanic or chemo-physical deposition processes or by precipitation processes from the gaseous phase like sputtering, PVD, CVD etc., and to deposit and build up such conducting layers or sealing coats or layers with active chemical surfaces, for instance, for receiving liquid, solid or gaseous substances in the case of sensors.

Further preferred options of use of the method according to the invention include the production of at least one channel in a printed circuit board, the exposure for the formation of hollow spaces, in particular three-dimensional hollow spaces, or cavities in a printed circuit board, the production of offset and/or stepped partial regions of a printed circuit board, the exposure of at least one element, particularly registering element, in the interior or in internal layers of a multilayer printed circuit board and/or the production of a rigid-flexible circuit board.

In the following, the invention will be explained in more detail by way of exemplary embodiments schematically illustrated in the accompanying drawing, of the method according to the invention for producing a multilayer printed circuit board according to the invention using the adhesion-preventing material of the invention and a stripping medium for subsequently removing the adhesion-preventing material.

SHORT DESCRIPTION OF THE DRAWINGS

Figure 3:
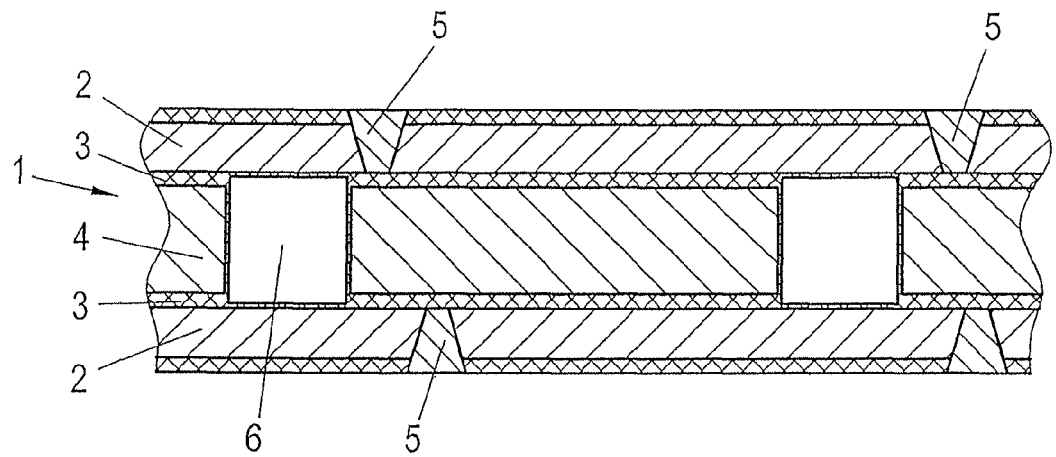
FIG. 3 illustrates a schematic section through a first embodiment of a planar material layer of a multilayer circuit board to be produced according to the invention in the form of a rigid portion of a rigid-flexible circuit board.
Figure 4:
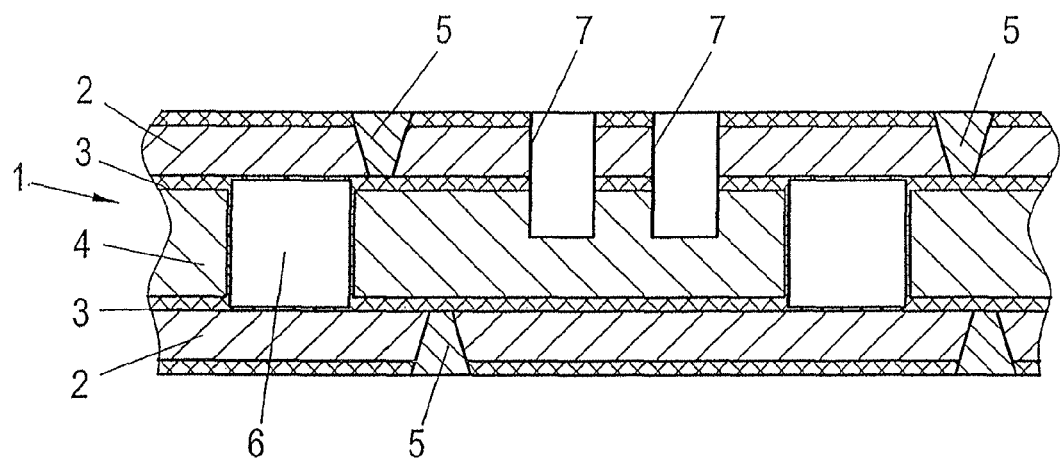
Figure 5:
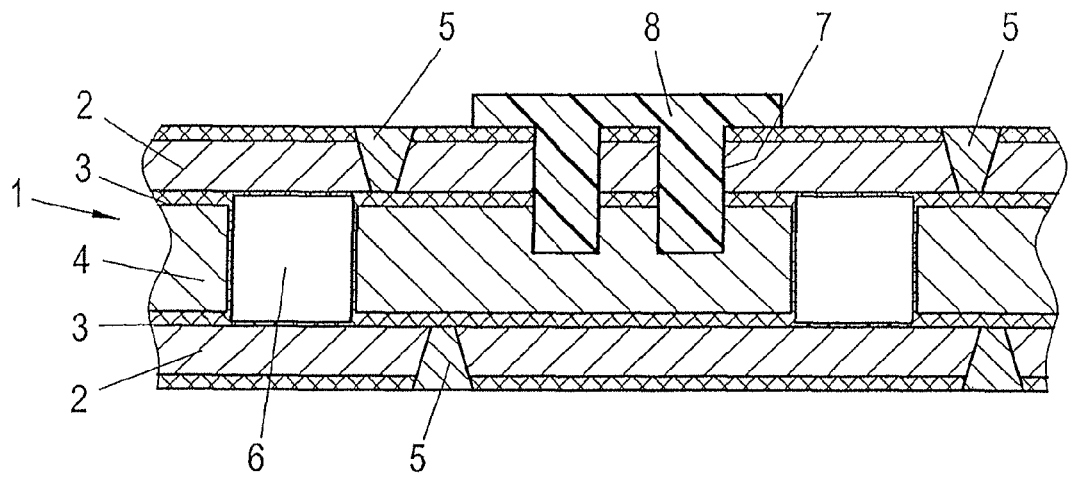
Figure 6:
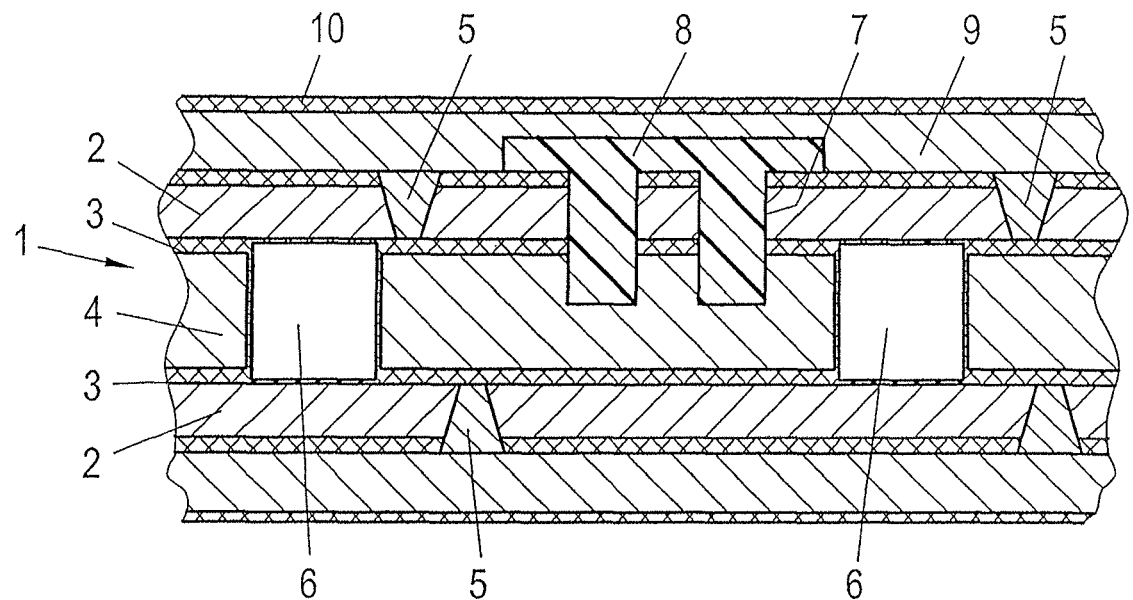
Figure 7:
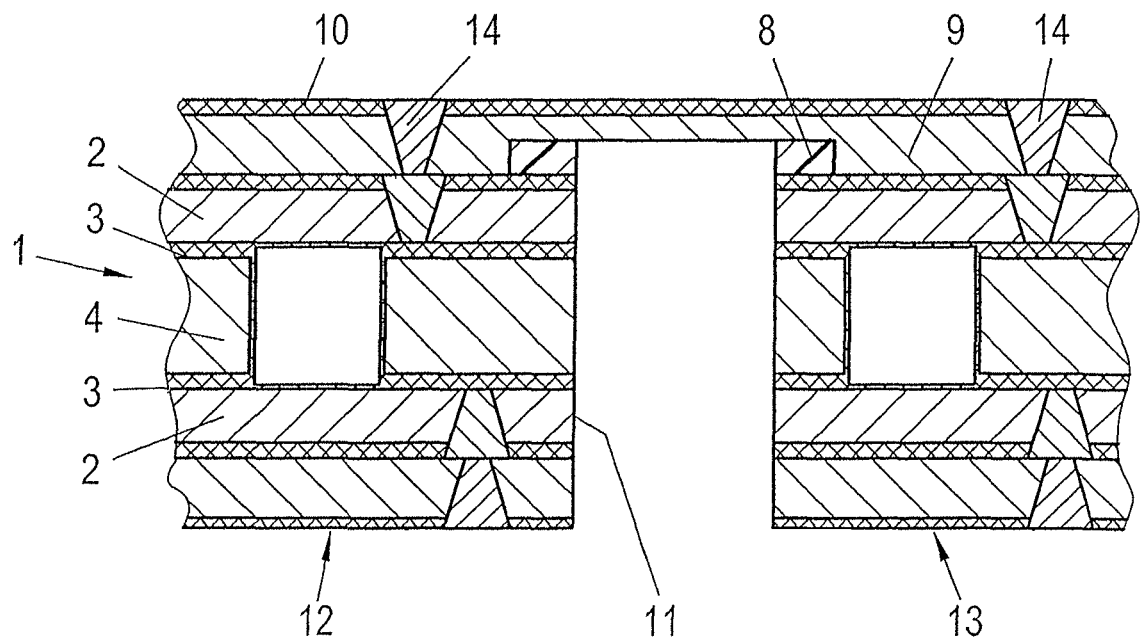
Figure 8:
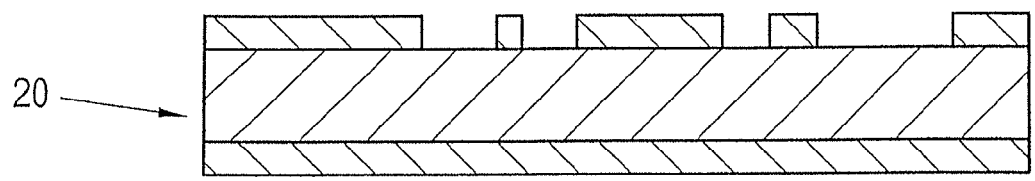
Figure 9:
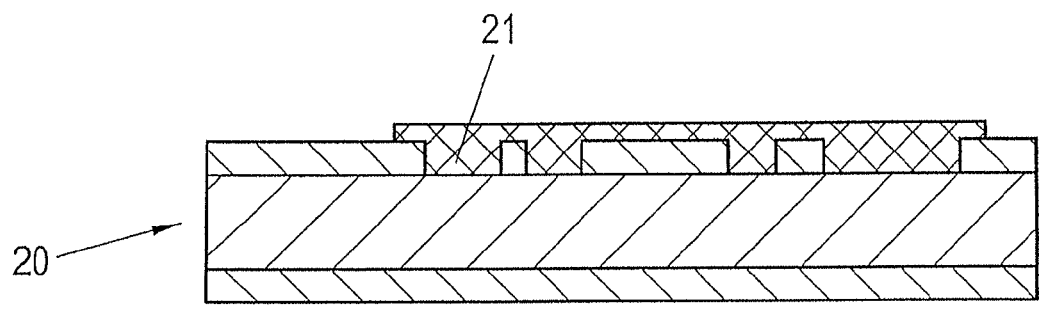
Figure 10:
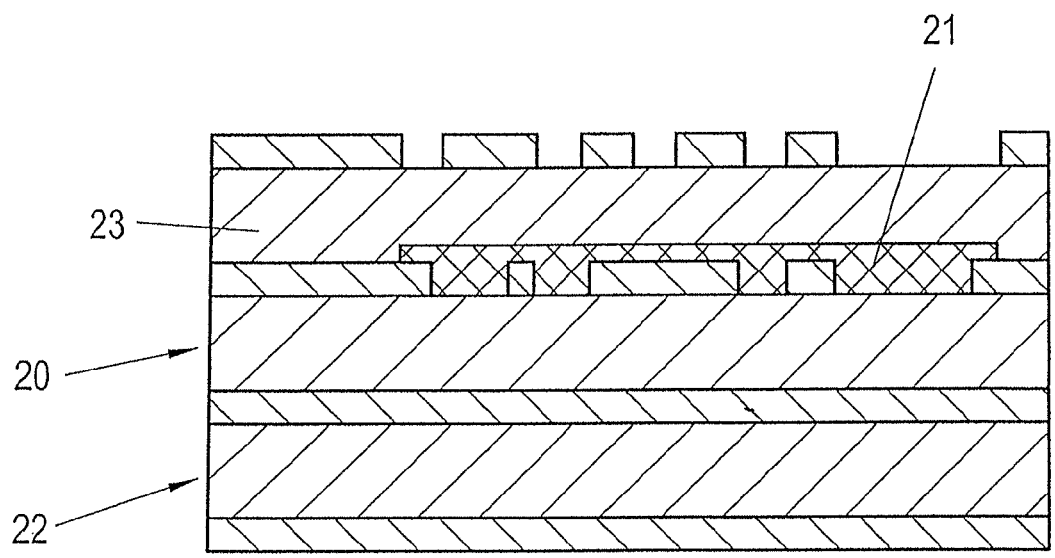
Figure 11:
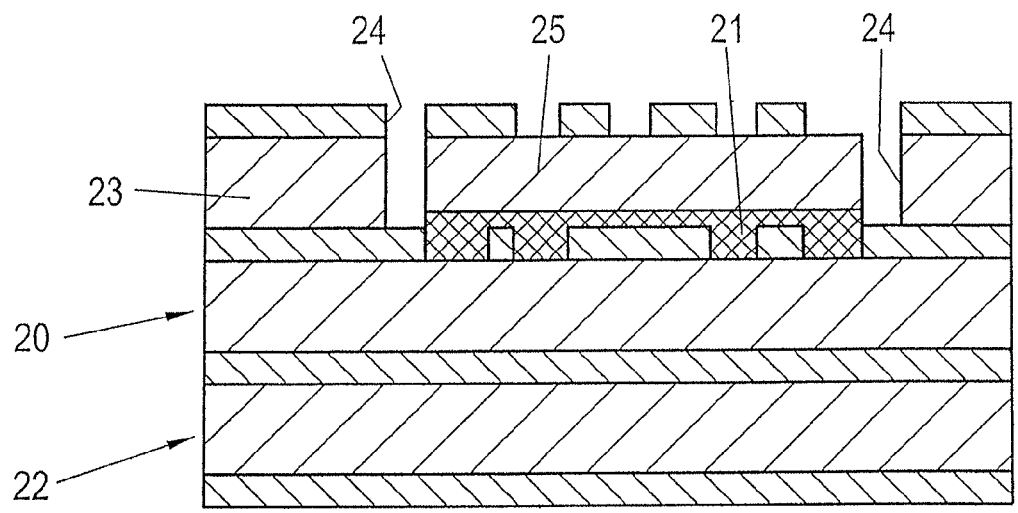
Figure 12:
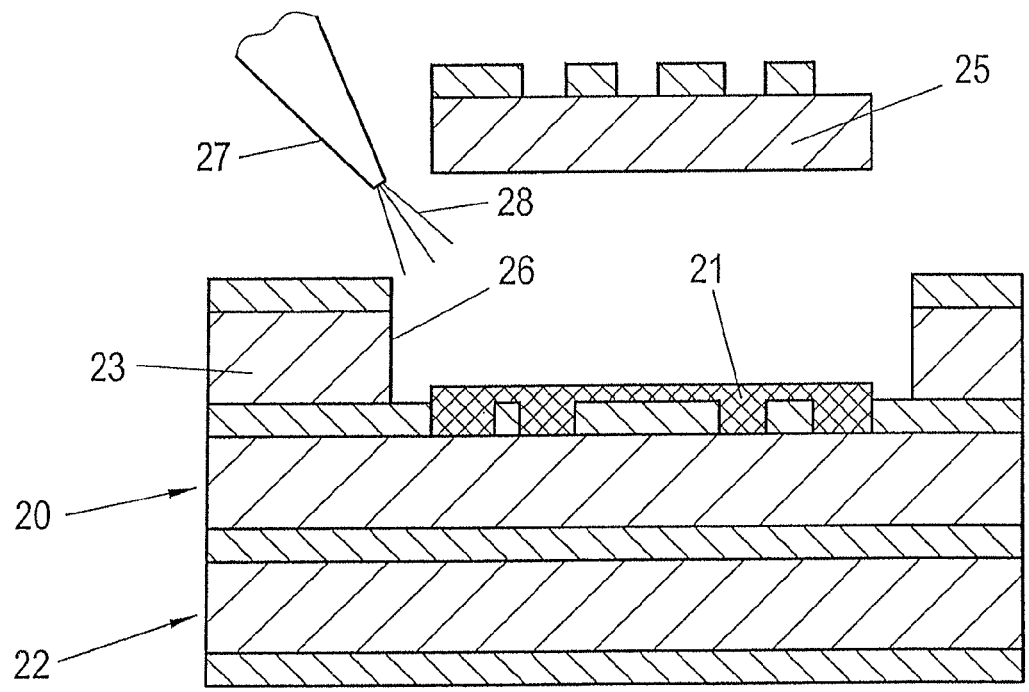

FIG. 4, in an illustration similar to that of FIG. 3, depicts a section through the rigid portion of a rigid-flexible printed circuit board, wherein milling edges are provided in the region of a subsequent separation of the partial region to be removed of the rigid portion;

FIG. 5, in an illustration similar to those of FIGS. 3 and 4, depicts a section through the rigid portion of the rigid-flexible printed circuit board, wherein an adhesion-preventing material according to the invention is provided or applied in the region of the subsequent separation and the milling edges to provide an exposed area for preventing a direct connection between the substantially planar material layers formed by the rigid portion and the flexible portion of the printed circuit board;

FIG. 6 illustrates another section again similar to those of the preceding Figures, wherein a layer of a non-conducting or dielectric material and a flexible portion of the rigid-flexible printed circuit board as a second substantially planar material layer are arranged on, or fixed to, the rigid portion of the first material layer;

FIG. 7 in another, similar section depicts the multilayer structure according to the invention in the form of a rigid-flexible printed circuit board after having cut through the rigid portion;

FIG. 8 is a schematic section through a modified embodiment of a substantially planar material layer of a multilayer printed circuit board as a multilayer structure according to the invention to be produced by the method of the invention;

FIG. 9 illustrates a schematic section through the planar material layer depicted in FIG. 8, wherein a layer of an adhesion-preventing material, or an adhesion-preventing material, according to the invention is applied;

FIG. 10 depicts a schematic section through the planar material layer illustrated in FIGS. 8 and 9, which is connected with at least one further planar material layer to produce the multilayer printed circuit board according to the invention;

FIG. 11, in an illustration similar to that of FIG. 10, depicts a schematic section through the partial region of the multilayer structure to be subsequently removed, which is delimited or defined by cutting; and FIG. 12 is an illustration similar to that of FIG. 11, with the cut or delimited partial region of FIG. 11 being removed.

DETAILED DESCRIPTION OF PREFERRED EMBODIMENTS

In the schematic flow diagram of FIG. 1, the supply of a first material layer of a multilayer circuit board to be produced is provided in a first step S1, whereupon, optionally after further preparative steps, which are known per se for the production of a printed circuit board and will not be discussed in detail for the sake of simplicity, the application of an adhesion-preventing material is performed in step S2, which will be discussed in detail below. The application of the adhesion-preventing material in the region of a partial region to be removed during subsequent treatment and processing steps, as will be explained in more detail particularly by way of the following Figures, after further treatment and processing steps, in particular connecting and/or pressing procedures of the multilayer circuit board illustrated in the following Figures, allows for the subsequent removal of a partial region thereof.

The application of the adhesion-preventing material according to step S2 is followed, in step 3, by the arrangement or provision of further layers or plies of the multilayer circuit board to be produced of conducting or conductive and non-conductive or insulating material.

After this, a connection of the individual layers or plies provided in steps S1 and S3, of the multilayer circuit board to be produced is established in step S4 in a likewise known manner, particularly by pressing while applying an elevated temperature and/or an elevated pressure, as is known in the context of the production of a multilayer circuit board.

Following the connecting, in particular pressing, procedure according to step S4, an optional step S5 is provided in the flow diagram of FIG. 1, according to which patterning of the partial region to be removed will be performed, for instance by producing or defining side edges, e.g. by milling or carving, as will likewise be discussed in more detail below, if the partial region to be subsequently removed is, for instance, not provided or applied in an accordingly patterned state already in step S3.

Figure 1:
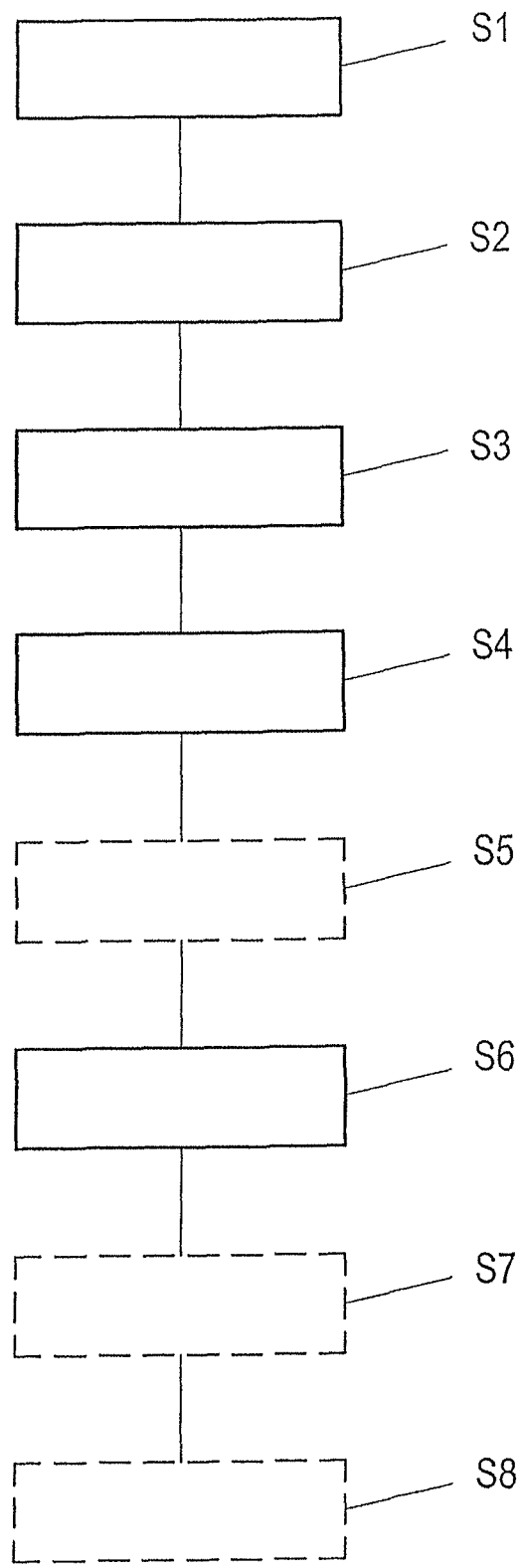
FIG. 1 is a schematic flow diagram of the method according to the invention for producing a multilayer circuit board.

Following the optionally provided step S5, the removal of the partial region to be removed is effected in step S6 of the flow diagram according to FIG. 1, said removal of the partial region to be removed being feasible in an accordingly simple and reliable manner by using the adhesion-preventing material.

After having removed the partial region to be removed according to step S6, the removal of residues of the adhesion-preventing material is optionally performed in step S7 by using a stripping material, wherein, due to the use of a adhesion-preventing material based on at least one metal soap as will be discussed in detail below by way of exemplary embodiments, an accordingly reliable and simple removal is enabled, wherein it is also referred to the exemplary embodiments described below as regards a stripping medium to be optionally employed.

Following the optional removal of residues of the adhesion-preventing material according to step S7, a further reception or arrangement of additional layers or plies of the multilayer circuit board and patterning of the same are optionally performed, again in a known manner, wherein a detailed explanation of such further steps has been omitted due to the familiarity with the subsequent treatment or processing steps.

In the context of the production of a multilayer circuit board by connecting, particularly pressing, a plurality of conducting or conductive and non-conducting or insulating layers or plies, it is known that usually employed glass fiber-reinforced resin materials partially comprising accordingly large differences in terms of flow characteristics and melt viscosities are used for the production of such multilayer circuit boards.

In the context of connecting or pressing such layers or plies of a multilayer circuit board, the minimum of the melt viscosity of a prepreg of such a glass fiber-reinforced resin is, for instance, generally determined by the degree of pre-crosslinking and, in addition, depends, for instance, on the heating rate provided in the press used for the production of the multilayer circuit board. A prepreg or glass fiber-reinforced resin material based on epoxy resin, for instance, has a minimum melt viscosity, and hence liquefaction, ranging between 70° C. and 100° C. at typical heating rates between 2° C. and 5° C., as is schematically indicated in FIG. 2.

Figure 2:
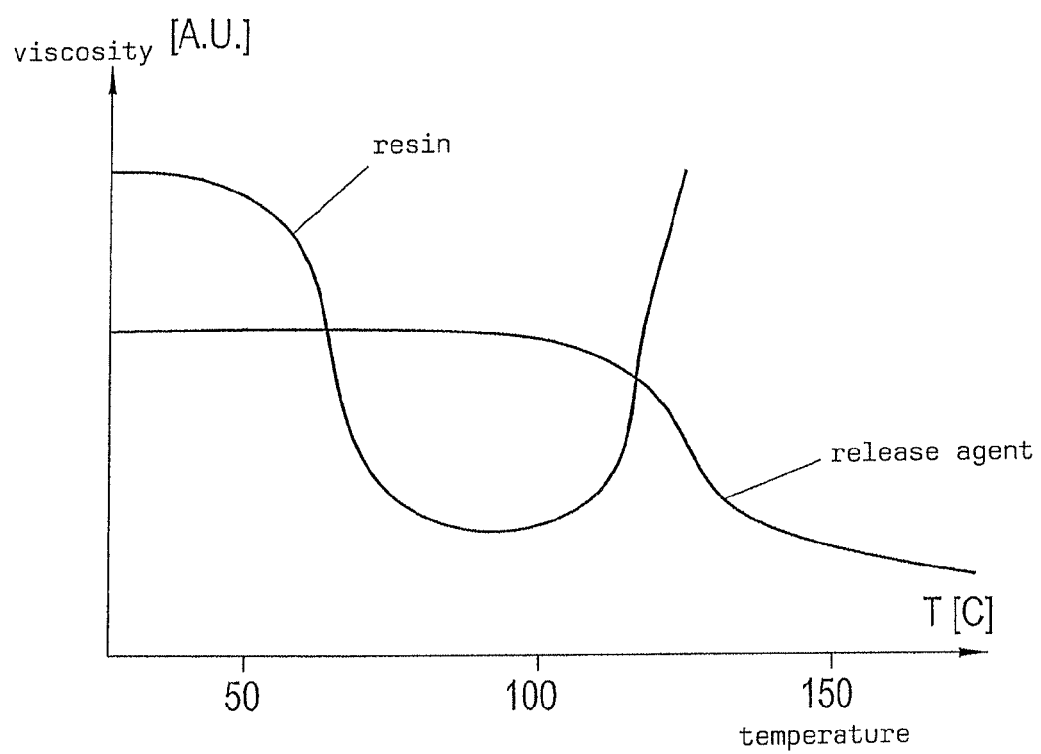
FIG. 2 depicts a schematic temperature and viscosity diagram of a resin material exemplarily used in the context of the production of a multilayer circuit board and of an adhesion-preventing material according to the invention.

After having reached the minimum viscosity and the respective gel point, the viscosity almost soars due to the progressing crosslinking of the resin and will usually result in a rapid solidification of such a resin material used in the production of a multilayer circuit board, cf. the steep rise in the viscosity at an increasing temperature according to FIG. 2. Such solidification while providing a strongly increasing viscosity can occur within a very short time of, e.g., 1 minute to 3 minutes.

Bearing in mind this inherently known viscosity behavior of materials usually used in the production of multilayer circuit boards, a release agent based on at least one metal soap is used for the adhesion-preventing material, which release agent will not melt before having reached the minimum viscosity of materials usually used in the production of multilayer circuit boards or has a decreasing viscosity, as is indicated in the schematic diagram of FIG. 2 by the viscosity of the release agent or adhesion-preventing material decreasing only after the onset of the strongly increasing viscosity considering the solidification of material usually employed in the production of a multilayer circuit board.

If the employed release agent were to melt, and hence have a decreasing viscosity, already at the time at which the resin material had a comparatively low viscosity, it would, as a rule, have to be anticipated, due to the elevated temperatures and pressures occurring during the connection of the layers or plies of a multilayer printed circuit board, that the desired patterned application of the adhesion-preventing material or release agent could not be reliably ensured, as will be explained in detail below.

It is, moreover, known that in the event of different polarities between mutually adjoining layers or plies or materials, mixing of such mutually adjoining layers or materials is largely prevented such that the adhesion-preventing material preferably comprises a difference in polarity relative to the adjoining layers or plies of the multilayer circuit board to be produced. Such a difference in polarity ensures that even at the onset of a reduction of the viscosity of the employed release agent or adhesion-preventing material, mixing with the resin material, which may also still have a low viscosity, will be prevented so as to enable the reliable maintenance of the desired separation effect of the adhesion-preventing material. By providing such a preferred polarity difference, it is moreover ensured that the release agent or adhesion-preventing material will not lose its separation effect relative to adjacent layers or plies of the multilayer circuit board even during optionally multiple connecting or pressing procedures, so that the desired separation effect will be maintained.

As is apparent from FIG. 2, it is essential for achieving the mutually tuned viscosities both of a material usually used in the production of a multilayer circuit board and of the release agent or adhesion-preventing material to be provided that the release agent has a melting point higher than 120° C., preferably 140° C. to 160° C., in order to ensure, at the onset of melting or the beginning reduction of the viscosity of the release agent, that the viscosity of the adjoining material of the multilayer circuit board will already be sufficiently high or increase so as to prevent the mutually adjoining materials from mixing in the region of the boundary surface.

In addition to the at least one release agent based on at least one metal soap as will be explained in detail below, the adhesion-preventing material also comprises a binder besides a solvent, which binder will, in particular, provide favorable properties during the application procedure, for instance by imprinting the adhesion-preventing material for achieving the desired patterning.

Such a binder is, for instance, comprised of a cellulose derivative, particularly cellulose ether or ester, preferably ethyl cellulose, the use of ethyl cellulose providing favorable properties in respect to the printing procedure to be performed and the patterning to be achieved. Bearing in mind the strongly differing solubilities of such a metal soap and ethyl cellulose, the use of ethyl cellulose as a binder, moreover, offers the advantage of the relatively polar matrix of ethyl cellulose at least partially migrating into the adjoining resin material during the connecting or pressing procedure of the individual layers of the multilayer circuit board, so that the adhesion-preventing material will become depleted of ethyl cellulose or, in general, binder on the boundary surface to an adjoining material layer. Such depletion of binder will further promote or enhance the separation effect of the adhesion-preventing material so as to consequently also promote or enhance the removal of a partial region to be removed.

In addition to the already beneficial separation effect after the removal of a partial region to be removed, as will be explained in detail by way of the following Figures, the metal soaps to be used as a release agent, moreover, also promote the simple and safe removal of the adhesion-preventing material by the aid of a stripping medium, which will also be explained in more detail below also by way of exemplary embodiments. The use of such a stripping medium will safeguard that possible residues of the adhesion-preventing material are safely removed and the region of the multilayer circuit board from which a partial region has been removed can thus be subjected to further processing, e.g. patterning and connecting with additional layers or plies in the context of subsequent treatment or processing steps. In addition, the safe removal of the adhesion-preventing material will, for instance, enable the removal of partial regions of a multilayer circuit board for repair purposes, whereby the respective replacement components of the multilayer circuit board can be used again after the supplemental removal of the adhesion-preventing material by the aid of the stripping medium.

The removal of the adhesion-preventing layer, moreover, enables the attachment of electronic components as well as mechanical parts of plastic or metal, such as retaining means, mechanical fixations and the like, by soldering or gluing with liquid and pasty adhesives, adhesive foils or metal-containing pastes in the thus produced cavity, and the thermal or electrical or thermal and electrically conductive connection of the same.

Basically, any metal soap based on saturated and unsaturated fatty acids, e.g. stearic, palmitic and olic acids of various metals, particularly Ca, Mg, Al, Zn, Na or the like can be used as release agent for the adhesion-preventing material. The portion of metal soap may vary between 5% and 45%.

Furthermore, any solvent providing good solubility for the binding agent and a sufficiently high boiling point for the printing process can be used for the adhesion-preventing material, wherein ethylene and propylene glycol ethers and esters (butyl glycol, hexyl glycol, butyl diglycol), diethylene glycol and polyglycol ethers and ethers can, for instance, be cited. The portion of solvent may vary between 30% and 80%.

Besides ethyl cellulose, also other cellulose ethers and esters can be used as binders.

The percentage of binder may vary between 3% and 25%. The viscosity may vary between 9 cPs and 80 cPs.

The following compositions may be used as adhesion-preventing materials (portions each indicated in percent by weight):

EXAMPLE 1

| | |
|---|---|
| Magnesium stearate | 27 |
| Dipropylene glycol methyl ether acetate | 67 |
| Ethyl cellulose | 6 |

EXAMPLE 2

| | |
|---|---|
| Aluminum stearate | 30 |
| Dipropylene glycol methyl ether acetate | 64 |
| Ethyl cellulose | 6 |

EXAMPLE 3

| | |
|---|---|
| Calcium stearate | 30 |
| Dipropylene glycol methyl ether acetate | 64 |
| Ethyl cellulose | 6 |

In order to provide a stripping medium for removing optionally present residues of the adhesion-preventing material, a mixture of a high-boiling solvent and an acid is provided, said acid, in particular, serving to dissolve the metal component of the respectively used metal soap. The particularly organic solvent, in particular, serves to dissolve the binder and the employed fatty acid of the adhesion-preventing material. For the complete and simple removal of the adhesion-preventing material, the stripping medium is directed onto the layer to be removed by spraying nozzles at pressures of >0.5 bar and <10 bar, preferably 1.5 to 2.5 bar, the removal of the material to be removed being achieved by mechanical abrasion and by incipient dissolution. The stripping medium is preferably initially heated to temperatures >20° C. and <120° C. and applied on the surface in the hot state, spraying through the nozzles preferably taking place from below in order to prevent the formation of solvent seas or accumulations on the printed circuit board, and consequently the sedimentation of optionally not completely dissolved suspended particles.

The removal of the adhesion-preventing material may, moreover, be performed in dipping basins, with mechanical agitators or ultrasonic transmitters being usable to assist the dissolution process.

The following acids may, in particular, be used as acids for the stripping medium: mineral acids or inorganic acids like hydrochloric acid or sulfuric acid, as well as organic acids like oxalic acid, acetic acid, formic acid, or complexing agents like ethylene diamine tetracetic acid.

Solvents providing a good solubility for the binder of the adhesion-preventing material may, in particular, be used as solvents, for instance ethylene glycol, diethylene glycol and polyglycol ethers like butyl glycol, hexyl glycol, butyl diglycol, propylene glycol ethers and esters, particularly acetates. Furthermore, also high-volatile solvents like alcohols, preferably isopropanol, ketones, preferably acetone, MEK, and esters, particularly ethyl acetate, as well as chlorinated solvents, preferably methylene chloride, chloroform, carbon tetrachloride.

In this case, the portion of acid may, for instance, vary between 0.5% and 10%.

For the reliable and simple removal of the adhesion-preventing material, the stripping medium is used at temperature between 20° C. and 120° C.

Examples of stripping media are as follows (portions each indicated in percent by weight):

Stripping Medium 1:

| | |
|---|---|
| Dipropylene glycol methyl ether acetate | 90 |
| Acetic acid (100%) | 10 |

Stripping Medium 2:

| | |
|---|---|
| Isopropanol | 98 |
| HCl (19%) | 2 |

Stripping Medium 3:

| | |
|---|---|
| Butyl diglycol | 97 |
| HCl (19%) | 3 |

Stripping Medium 4:

| | |
|---|---|
| Acton | 95 |
| Formic acid conc. | 5 |

Stripping Medium 5:

| | |
|---|---|
| Dipropylene glycol methyl ether acetate | 95 |
| HCl (19%) | 5 |

The method for producing a multilayer printed circuit board using an adhesion-preventing material for subsequently removing a partial region of such a multilayer printed circuit board, which is schematically illustrated in FIG. 1, will be explained in more detail below by way of the exemplary embodiments of the production of different multilayer printed circuit boards, which are respectively depicted in FIGS. 3 to 7 and 8 to 12.

FIG. 3 is a schematic illustration of a rigid, multilayer portion 1 as a first substantially planar material layer of a rigid-flexible printed circuit board to be subsequently produced as a multilayer structure. Individual metal or copper layers 2 are, for instance, separated by prepreg layers 3 and a core 4. Connections between the individual copper layers 2 are indicated via microvias 5 and passages 6, respectively.

For the production of a rigid-flexible printed circuit board, milling edges 7 are formed in the region of a subsequent separation of the rigid multilayer portion 1 of the rigid-flexible printed circuit board to be produced, as indicated in FIG. 4.

In order to provide a free space, or prevent the direct connection between the printed circuit board rigid portion 1 to be subsequently divided or cut through and a layer of non-conductive or dielectric material to be provided and arranged as a second substantially planar material layer of the printed circuit board for connection with a flexible portion, a material preventing such an adhesion or anti-adhesion material 8 is provided following the formation of the milling edges 7, in the region of the subsequent separation and in the channels or grooves formed by the milling edges 7, e.g. according to step S2 of FIG. 1, in the embodiment depicted in FIGS. 3 to 7. The anti-adhesion material as discussed above is applied or introduced in the region of the subsequent separation as well as into the milling edges 7 by simple method steps, e.g. by a printing process, in particular screen-printing or stencil-printing. Depending on the used material 8, a drying and/or curing process may be provided following the application of the material or paste 8.

In order to obtain accordingly thin layer thicknesses or overall thicknesses of the rigid-flexible printed circuit board to be produced, it is moreover provided that the adhesion-preventing material 8 is applied in a layer thickness of less than 25 µm, in particular less than 15 µm, in the region of the subsequent separation and hence removal of a partial region.

While, in the embodiment represented in FIGS. 3 to 7, the formation of milling edges 7 is provided prior to the application of the anti-adhesion material 8, the material 8 may alternatively be applied in the region of the subsequent division of the rigid and, in particular, multilayer portion of the printed circuit board, whereupon the milling edges 7 will pass through the applied material 8.

As depicted in FIG. 6, the application of the anti-adhesion material 8 in the region of the subsequent division as well as the milling edges 7, for instance in accordance with step S3 of FIG. 1, is followed by the application or arrangement of a bonding layer 9 of non-conductive or dielectric material, said bonding layer 9 being, for instance, comprised of a foil known per se, for instance a prepreg or RCC foil, or even a liquid dielectric material. Following the layer 9 of non-conductive or dielectric material, a flexible partial region 10 of the rigid-flexible printed circuit board to be produced is indicated, wherein the flexible portion 10 of the rigid-flexible printed circuit board to be produced, like the rigid portion 1, may be comprised of several layers. After the arrangement of the individual layers or plies, connecting, in particular pressing, is performed according to step S4 of FIG. 1.

By the arrangement of the adhesion-preventing material, prefinishing and/or formatting for the non-conductive or dielectric material layer 9 to be provided can be renounced, in particular, in the region of the subsequent separation in the region of the milling edges 7 such that preparation steps for the non-conductive or dielectric material layer 9 to be provided will be simplified or reduced. Concerning the adhesion-preventing mechanism between the individual layers, it is additionally referred to the comments relating to FIG. 2.

By providing the exempt area in the region of the application of the adhesion-preventing material 8 on the rigid portion 1 of the rigid-flexible printed circuit board to be produced, thinner layer thicknesses of the layer 9 will, moreover, do, said thickness being, for instance, selected to be less than 50 µm and, in particular, 40 µm or less. The provision of such thin layer thicknesses of the layer of non-conductive material to be arranged between the rigid portion 1 and the flexible portion 10 of the rigid-flexible printed circuit board to be produced will not only promote a reduction of the overall thickness of the rigid-flexible printed circuit board to be produced, but the positioning and registering accuracy of the portions to be bonded and of subsequent passages or microvias will also be enhanced.

FIG. 7 depicts a section through the rigid-flexible printed circuit board formed by the rigid portion 1 and the flexible portion 10 as a multilayer structure, wherein a division 11 has been provided between the then separated rigid partial regions 12 and 13 in the region of the milling edges 7. This division 11 constitutes a partial region to be subsequently removed according to step S6 of FIG. 1, after having connected the planar material layers. It is, moreover, indicated that a connection between the flexible portion 10 of the printed circuit board and the then separated rigid partial regions 12 and 13 is achievable by additional microvias or passages 14.

As is further apparent from the illustration according to FIG. 7, it is possible, without having to consider or observe very precise tolerances in terms of the cutting depth of the non-bonded area or partial region 11 to be removed, to facilitate also the production of the non-bonded area, and hence subsequent method steps, by providing the connection-free or connection-preventing region through the application of the adhesion-preventing material 8.

By the appropriate choice of the anti-adhesion material 8 and the layer 9 of non-conductive or dielectric material to be arranged between the rigid portion 1, or subsequently separated rigid portions 12 and 13, respectively, and the flexible portion 10 of the printed circuit board, it will be readily feasible to take into account legal limitations required when using specific hazardous substances in electric and electronic equipment.

By providing the bond-free area through the application of an anti-adhesion material 8, simple method steps will do, in particular, in the preparation or production of the layer 9 to be arranged between the flexible portion 10 and the rigid portion 1 as well as in subsequent method steps for realizing the division.

By using thin layer thicknesses for connecting the flexible portion 10 as well as the rigid portion 1, and the mutually separated rigid portions 12 and 13, respectively, and the thus achievable thin layer thickness as well as the hence resulting improvements in the registering accuracy, it has, moreover, become possible to provide printed circuit boards with flexible layers 10 for highly complex components even in large formats, for instance in the production format of HDI circuit boards of more than 18×24 inch.

The embodiment of a multilayer rigid printed circuit board, or rigid portion 1 of a printed circuit board, which is depicted in FIGS. 3 to 7, for illustration purposes merely represents a simplified example of such a multilayer printed circuit board as a multilayer structure, wherein also a larger number or plurality of, in particular, conductive layers 2 and feedthroughs via microvias 5 or passages 6 and 14, respectively, may be employed as a function of the desired complexity of the component to be produced.

In the exemplary embodiment illustrated in FIGS. 8 to 12, of a modified multilayer structure, again in the form of a multilayer printed circuit board to be produced, a structured core of such a printed circuit board is generally denoted by 20, which core 20 comprises several layers with, in particular, the upper layer depicted in FIG. 8 being accordingly structured in correspondence with step S1 of FIG. 1.

The core 20, which is comprised of one or several layer(s) and constitutes a substantially planar material layer, in a partial region is subsequently provided with an adhesion-preventing material or anti-adhesion material 21, e.g. according to step S2 of FIG. 1, for connection with further layers or plies as additional substantially planar material layers, as illustrated in FIG. 9, said anti-adhesion material being, for instance, applied by screen-printing.

Following the application of the adhesion-preventing material 21 on the substantially planar material layer formed by the core 20 as illustrated in FIG. 9, connecting or bonding in a manner known per se and in correspondence with steps S3 and S4 of FIG. 1, for instance by a laminating process, of the planar core 20 with a plurality of again substantially planar material layers 22 and 23 is effected, the partial region provided with the anti-adhesion material being again denoted by 21 in FIG. 10. The planar material layer 23 illustrated in FIG. 10 may again be designed in an accordingly patterned manner, especially on its upper side.

Following the connecting procedure illustrated in FIG. 10, between the plurality of substantially planar material layers 20, 22 and 23, a delimitation or definition of a partial region 25 of the substantially planar material layer 23 is effected, for instance, by cutting, in particular laser cutting, while forming cutting lines or impressions 24, as is apparent from FIG. 11 and corresponds to step S5 of FIG. 1. The anti-adhesion material 21 provided below the partial region 25 to be removed renders feasible in a simple manner, after the formation of the cutting line or delimiting impressions 24, the simple and reliable removal of the partial region 25, as illustrated or indicated in FIG. 12 and in correspondence with step S6 of FIG. 1.

In the embodiment depicted in FIGS. 8 to 12, additional layers are indicated between and/or beside the individual substantially planar material layers, which additional layers are known as such in the context of the fabrication of a multilayer printed circuit board and, therefore, are not discussed in detail, as is also indicated in respect to step S8 of FIG. 1.

Also from the embodiment according to FIGS. 8 to 12, it is clearly apparent that the bond-free area provided in the context of bonding substantially planar materials or material layers 20, 22 and 23 by applying an adhesion-preventing material 21 according to the above exemplary embodiments will subsequently allow for the simple and reliable removal of partial regions 25 of at least one substantially planar layer 23 to be bonded therewith.

The cutting and, for instance, laser cutting operation illustrated and mentioned in FIG. 11 may, for instance, be replaced with a milling operation as described in the embodiment according to FIGS. 3 to 8, or a scratching or similar dividing operation of the at least one material layer 23.

In FIG. 12, a spraying head or spraying nozzle 27 is, moreover, indicated, by which a stripping medium of the above-identified kind is applied according to the indicated jets 28 and in correspondence with step S7 of FIG. 1 after the removal of the partial region 25 to be removed, in order to eliminate residues of the adhesion-preventing material 21 so as to enable further processing of the multilayer circuit board also in the region of the partial region 25 to be removed.

From the embodiment according to FIGS. 8 to 12, it is apparent that a hollow space or cavity 26, in particular a three-dimensional hollow space, can, for instance, be formed in partial regions or individual layers or plies of a multilayer printed circuit board by removing a partial region 25.

It is, moreover, possible to use such a cavity 26 formed by the removal of the partial region or element 25 to subsequently arrange separated elements in interior regions or inner layers of a multilayer printed circuit board.

The removal of partial regions, moreover, allows for the production of a printed circuit board with offset and/or stepped partial regions for special applications.

In addition to the printing methods, e.g. screen-printing, mentioned in the above exemplary embodiments for the application of the anti-adhesion material 8 or 21, respectively, offset printing, flexoprinting, tampon printing, ink-jet printing or the like may be provided or used, in particular, as a function of the nature of the anti-adhesion material.

By the option provided by the invention to apply the metal soap-based adhesion-preventing material 8 or 21 in a patterned manner, subsequent methods steps, in particular relating to the removal of subsequently removable partial regions 11 or 25 of a multilayer structure, will be facilitated in a simple manner.

By using an anti-adhesion material layer 8 or 21 which can, for instance, be applied by a simple printing technique, formatting and confectioning techniques as are provided in the prior art, for instance for separation foils, can be obviated.

Particularly in the context of the production and treatment or processing of multilayer printed circuit boards, the exposure or provision of an anti-adhesion material 8 or 21 will enable the formation of a space 26 for additional components, for instance by a local thickness reduction, as already mentioned above. Such a provision of a space 26, in particular and substantially in the interior of such a multilayer printed circuit board will, moreover, enable a reduction of the overall thickness of such a multilayer printed circuit board by the embedment of such components, thus taking into account the requirements of a miniaturization of printed circuit boards.

By a local thickness reduction, it has, for instance, become possible to contact additional components to be arranged in the region of the removed partial region 25, in particular after the removal of the optionally remaining anti-adhesion material 21, as indicated in FIG. 12, directly on the bottom of such a recess or cavity 26, with residues of the anti-adhesion material 21 having been removed to improve contacting, as indicated in FIG. 12 by the spraying nozzle 27. In doing so, it is, for instance, possible in a simple manner to arrange the respective contact elements or conductive structures, in case of the material layer 20 provided in FIG. 8, in the region of the cavity 26 to be subsequently produced, as is illustrated in FIG. 12.

As already pointed out above, the subsequent removal of partial regions 25 while forming cavities 26 will also render feasible the provision of accordingly three-dimensional open or optionally closed cavities, wherein it is feasible, for instance when departing from the condition represented in FIG. 12, to provide further layers of a multilayer printed circuit board as in correspondence with step S8 of FIG. 1.

By the appropriate choice or arrangement of the adhesion-preventing material 8 or 21, it is, moreover, possible to enable the formation of cavities 26 over several layers of such a multilayer conductor structure, as is, for instance, indicated in FIG. 7 with reference to the first embodiment.

In the context of the production of printed circuit boards, it is, thus, for instance, also possible to provide an accordingly simplified exposure of registering elements by removing partial regions 25.

The formation of stepped or offset partial regions, for instance, allows for the creation of interleaved or overlapping portions of a multilayer printed circuit board.

By removing partial regions by applying the adhesion-preventing material 8 or 21, it will, moreover, be possible to, for instance, provide repair options of already existing or populated printed circuit boards with embedded components, if, for instance, an adhesion-preventing material is provided as a precaution in the region of components possibly subject to high failure or damage rates, so as to enable the repair of a printed circuit board by removing a partial region in the event of a defect of such a component rather than requiring its complete substitution, thus enabling the simple exchange of components and the simple provision of a multilayer structure comprised of at least two substantially planar material layers to be bonded.

The invention claimed is:

1. A method for producing a multilayer printed circuit board from a plurality of layers to be connected to each other, in particular to be pressed together, comprising the following steps:
providing at least partially planar layers with at least a partial region to be removed thereof;
applying a material preventing adhesion onto the partial region to be removed, wherein the material preventing adhesion is formed by a mixture comprising a release agent on the basis of at least one metal soap, a binding agent, and a solvent, wherein the release agent is used in an amount of less than 60% by weight of the adhesion-preventing material;
connecting the at least partially planar layers; and
removing the partial regions to be removed.

2. The method according to claim 1, wherein the release agent is used on the basis of saturated and unsaturated fatty acids.

3. The method according to claim 2, wherein the release agent is stearic, palmitic or olic acids.

4. The method according to claim 1, wherein a cellulose derivative is used as a binding agent.

5. The method according to claim 4, wherein the cellulose derivative is cellulose ether or ester, or ethyl cellulose.

6. The method according to claim 1, wherein the amount of binding agent is chosen to be less than 35% by weight.

7. The method according to claim 6, wherein the amount of binding agent is between 3% by weight and 25% by weight.

8. The method according to claim 1, wherein the solvent has a boiling point of below 220° C.

9. The method according to claim 8, wherein the solvent has a boiling point of about 180° C. to 200° C.

10. The method according to claim 1, wherein ethylene or polypropylene glycol ethers and esters are used as solvents.

11. The method according to claim 1, wherein the amount of solvent is less than 85% by weight of the adhesion-preventing material.

12. The method according to claim 11, wherein the amount of solvent is 30% by weight to 80% by weight of the adhesion-preventing material.

13. The method according to claim 1, wherein the adhesion-preventing material is applied by a printing process.

14. The method according to claim 13, wherein the printing process is a screen-printing, a stencil-printing, an offset printing, a flexoprinting, a tampon printing, or an ink jet printing process.

15. The method according to claim 1, wherein the adhesion-preventing material is subjected to a drying or curing process after its application.

16. The method according to claim 1, wherein the adhesion-preventing material is applied in a layer thickness of less than 25 μm.

17. The method according to claim 16, wherein the adhesion-preventing material is applied in a layer thickness of less than 15 μm.

18. The method according to claim 1, wherein the adhesion-preventing material comprises a polarity difference relative to the adjoining, substantially planar layers or plies.

19. The method according to claim 1, wherein the anti-adhesion material has a softening or melting point of at least 120° C.

20. The method according to claim 19, wherein the anti-adhesion material has a softening or melting point of 140° C. - 160° C.

21. The method according to claim 1, wherein, after the removal of the partial region to be removed, the adhesion-preventing material is removed by applying a stripping medium.

22. The method according to claim 21, wherein the stripping medium is comprised of a mixture of a high-boiling solvent and an acid.

23. The method according to claim 21, wherein the adhesion-preventing material is removed by spraying with a heated, solvent under elevated pressure or in a dipping basin using ultrasound or mechanical agitators to enhance solubility.

24. The method according to claim 21, wherein the stripping medium comprises at least 80% of the high-boiling solvent.

25. The method according to claim 24, wherein the stripping medium comprises at least 90% of the high-boiling solvent.

26. The method according to claim 21, wherein the solvent is selected from the group consisting of ethylene glycol, diethylene glycol and polyglycol ethersand esters as well as chlorinated solvents.

27. The method according to claim 26, wherein the solvent is selected from the group consisting of butyl glycol, hexyl glycol, butyl diglycol, propylene glycol ethers and esters, acetates, alcohols, and ketones.

28. The method according to claim 21, wherein the stripping medium is used in an amount of less than 20% by weight.

29. The method according to claim 28, wherein the stripping medium is used in an amount of 0.5% by weight to 10% by weight.

30. The method according to claim 21, wherein the solvent in the stripping medium is comprised of inorganic acids, or of organic acids, or of complexing acids.

31. The method according to claim 30, wherein the inorganic acid comprises hydrochloric acid or sulfuric acid; wherein the organic acid comprises oxalic acid, acetic acid, or formic acid; and wherein the complexing acid comprises ethylenediamine tetracetic acid.

32. The method according to claim 21, wherein the removal of the adhesion-preventing material is performed at a temperature below 150° C.

33. The method according to claim 32, wherein the removal of the adhesion-preventing material is performed at a temperature between 20° C. and 120° C.

34. The method according to claim 1, wherein layers or plies to be connected, of the multilayer circuit board are connected by a laminating process.

35. The method according to claim 1, wherein edge regions of the at least one partial region to be removed are defined or removed by milling, scratching, or cutting.

36. The method according to claim 1, wherein the release agent is used in an amount of about 5% by weight to 45% by weight of the adhesion-preventing material.

37. The method according to claim 1, wherein metal soap comprises the fatty acid salts of Al, Mg, Ca, Na and Zn.

* * * * *

UNITED STATES PATENT AND TRADEMARK OFFICE
CERTIFICATE OF CORRECTION

| | | |
|---|---|---|
| PATENT NO. | : 8,685,196 B2 | |
| APPLICATION NO. | : 13/145651 | |
| DATED | : April 1, 2014 | |
| INVENTOR(S) | : Weichslberger et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 146 days.

Signed and Sealed this

Twenty-ninth Day of September, 2015

Michelle K. Lee

*Director of the United States Patent and Trademark Office*